US010008420B2

(12) United States Patent
Zhou et al.

(10) Patent No.: US 10,008,420 B2
(45) Date of Patent: Jun. 26, 2018

(54) EMBEDDED SIGE EPITAXY TEST PAD

(71) Applicant: Shanghai Huali Microelectronics Corporation, Shanghai (CN)

(72) Inventors: Haifeng Zhou, Shanghai (CN); Jun Tan, Shanghai (CN)

(73) Assignee: SHANGHAI HUALI MICROELECTRONICS CORPORATION, Shanghai (CN)

(*) Notice: Subject to any disclaimer, the term of this patent is extended or adjusted under 35 U.S.C. 154(b) by 99 days.

(21) Appl. No.: 14/691,516

(22) Filed: Apr. 20, 2015

(65) Prior Publication Data

US 2016/0225678 A1   Aug. 4, 2016

(30) Foreign Application Priority Data

Jan. 30, 2015   (CN) .......................... 2015 1 0050661

(51) Int. Cl.
*H01L 21/66* (2006.01)
*H01L 29/06* (2006.01)
*H01L 29/161* (2006.01)

(52) U.S. Cl.
CPC .............. *H01L 22/12* (2013.01); *H01L 22/30* (2013.01); *H01L 29/0649* (2013.01); *H01L 29/0657* (2013.01); *H01L 29/161* (2013.01)

(58) Field of Classification Search
CPC ... H01L 22/12; H01L 29/0649; H01L 29/161; H01L 29/0657; H01L 22/30; H01L 21/02532; H01L 21/30604; H01L 21/30625; H01L 22/34; G01B 7/16; G01B 15/06; G01B 2210/56; G01N 21/95684; G01N 21/9501; G01N 21/95607; H01J 37/28; H01J 2237/24592; H01J 2237/24578

See application file for complete search history.

(56) References Cited

U.S. PATENT DOCUMENTS 6,906,400 B2   6/2005 Delhougne et al.
6,946,350 B2   9/2005 Lindert et al.
6,949,482 B2   9/2005 Murthy et al.
(Continued)

FOREIGN PATENT DOCUMENTS

EP            1801864 B1    11/2009

*Primary Examiner* — Michael Carter
*Assistant Examiner* — Mohammed R Alam
(74) *Attorney, Agent, or Firm* — Kilpatrick Townsend & Stockton LLP

(57) ABSTRACT

Techniques for measuring and testing a semiconductor wafer during semiconductor device fabrication include designating a test area on the top surface of the wafer and etching a first rectangular trench and a second rectangular trench on the top surface of the wafer in the test area. The trenches are oriented such that a length of the first trench is perpendicular to a length of the second trench, and positioned such that the length of the first trench, if extended, intersects the length of the second trench. A silicon-germanium compound is deposited into the first trench and the second trench, and a test pad is removed from the test area of the wafer. The test pad includes a side surface where both the first trench and the second trench are exposed. The side surface of the test pad is scanned with a transmission electron microscope to take measurements of the silicon-germanium.

10 Claims, 4 Drawing Sheets

(56) References Cited

U.S. PATENT DOCUMENTS

| | | |
|---|---|---|
| 7,494,884 B2 | 2/2009 | Lin et al. |
| 7,553,717 B2 | 6/2009 | Chakravarthi et al. |
| 7,615,390 B2 | 11/2009 | Meunier-Beillard et al. |
| 7,989,298 B1 | 8/2011 | Chan et al. |
| 8,017,487 B2 | 9/2011 | Chong et al. |
| 8,183,118 B2 | 5/2012 | Lu et al. |
| 8,674,447 B2 | 3/2014 | Adam et al. |
| 2005/0148147 A1 | 7/2005 | Keating et al. |
| 2006/0138398 A1 | 6/2006 | Shimamune |
| 2008/0290370 A1 | 11/2008 | Han |
| 2008/0318375 A1* | 12/2008 | Van Noort ........ H01L 29/66795 438/212 |
| 2012/0316855 A1* | 12/2012 | Park ........................ H01L 22/12 703/13 |
| 2012/0319120 A1 | 12/2012 | He et al. |
| 2012/0319168 A1 | 12/2012 | Liu et al. |
| 2012/0326268 A1 | 12/2012 | Kato et al. |
| 2013/0026464 A1* | 1/2013 | Liao ........................ H01L 22/30 257/48 |

\* cited by examiner

EMBEDDED SIGE EPITAXY TEST PAD

CROSS-REFERENCES TO RELATED APPLICATIONS

The present application claims priority to Chinese Patent Application No. 201510050661.X, filed on Jan. 30, 2015, entitled "DESIGN OF EMBEDDED SIGE EPITAXY TEST PAD", which is incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to semiconductor processes and devices.

Since the early days when Dr. Jack Kilby at Texas Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and pushing toward the boundary of what are physically possible. Huali Microeletronic Corporation™ is one of the leading semiconductor fabrication companies that has focused on the research and development of semiconductor devices and processes.

An important aspect of semiconductor manufacturing is to provide test pads on a wafer to ensure the quality of semiconductor devices manufactured on the wafer. For example, sharing the same underlying semiconductor substrates with and being subjected to some of the processes as the actual devices, the test pads provide a useful way for testing and validating the devices. Conventional test pads and methods of using thereof exist, but, unfortunately, are inadequate. Therefore, improved systems and methods for test pads are desired.

BRIEF SUMMARY OF THE INVENTION

The present invention is directed to semiconductor devices and methods thereof. In particular, embodiments of the present invention provide techniques for measuring and testing a semiconductor wafer during semiconductor device fabrication, which involves designating a test area on the top surface of the wafer and etching a first rectangular trench and a second rectangular trench on the top surface of the wafer in the test area. The trenches are oriented such that a length of the first trench is perpendicular to a length of the second trench, and positioned such that the length of the first trench, if extended, intersects the length of the second trench. There are other embodiments as well.

In an embodiment, a method is presented for measuring and testing semiconductor wafers during the processes of semiconductor device fabrication. The method includes designating a test area on the top surface of a wafer and etching a first and a second rectangular trench in the test area. The trenches are oriented such that the length of the first trench is perpendicular to the length of the second trench. The trenches are positioned such that extending the length of the first trench intersects the length of the second trench. A silicon-germanium compound is deposited into the first trench and the second trench. Next, a test pad is removed from the test area of the wafer. Both the first trench and the second trench are exposed on a side surface of the test pad. A transmission electron microscope is used to scan the side surface of the test pad and take measurements of the silicon-germanium.

In another embodiment, a test pad cut from a semiconductor wafer is provided for measuring and testing the semiconductor wafer during semiconductor device fabrication. The test pad includes a first and a second rectangular trench on the top surface. The trenches are oriented such that the length of the first trench is perpendicular to the length of the second trench. The trenches are positioned such that the length of the first trench, if extended, intersects the length of the second trench. A side surface of the test pad exposes both the first trench and the second trench.

It is to be appreciated that embodiments of the present invention provides numerous advantages over conventional techniques.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Figure 1A:
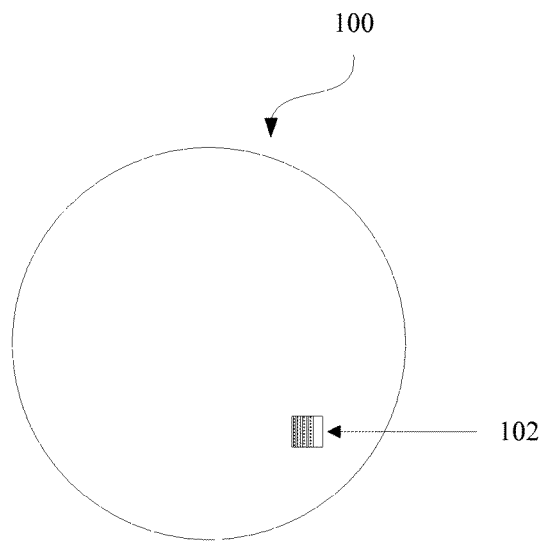
FIG. 1A is an illustration of the top view of a semiconductor wafer with a designated test area.

The present invention is directed to semiconductor devices and methods thereof. In particular, embodiments of the present invention provide techniques for measuring and testing a semiconductor wafer during semiconductor device fabrication, which involves designating a test area on the top surface of the wafer and etching a first rectangular trench and a second rectangular trench on the top surface of the wafer in the test area. The trenches are oriented such that a length of the first trench is perpendicular to a length of the second trench, and positioned such that the length of the first trench, if extended, intersects the length of the second trench. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In semiconductor technology, techniques and methods for improving the performance of semiconductor devices is a very important topic. With the feature size and grid oxide layer being continuously narrowed, migration rate of current carrier is greatly reduced. This leads to reduced ON state current and degenerating device performance. For the 22 nm high performance process, simply reducing the key size is insufficient to meet device performance requirements. This is especially true for P-type metal-oxide-semiconductor (PMOS) transistor devices because the hole mobility is two times lower than the electron mobility.

Silicon-germanium (SiGe) technology has been advanced to improve device performance by increasing carrier mobility, which is the most important and core factor for high performance technologies of 22 nm or less. Electron mobility of germanium is two times that of silicon, and hole mobility of germanium is four times that of silicon.

For example, in the 90 nm technology process, Intel® uses SiGe source/drain (S/D) strain enhancer during the manufacture of high performance logic devices. This has become the important turning point for the SiGe technology. The next 45 nm, 32 nm and 22 nm technology processes use embedded SiGe, and the germanium content has been gradually increased from 15% to 40%. As the PMOS transistor size narrows, embedded epitaxial SiGe source drain (S/D) technology is heavily relied upon to strengthen the PMOS transistor drive current.

To test and measure the performance of embedded SiGe, a test pad (e.g., with a size of 50*50 um$^2$) can be cut from the semiconductor wafer. An ellipsometer is used on the test pad to measure the thickness of SiGe epitaxial growth and the concentration of germanium. Other measurements, such as defects in the rest process of growth and thickness of excessive growth can only be measured by transmission electron microscopy (TEM) scanning. This often requires a large number of samples, which means more resources are needed for failure analysis.

FIG. 1A is an illustration of the top view of a semiconductor wafer 100 with a designated test area. Trenches are etched for SiGe epitaxial growth in the test area on the top surface of wafer 100 during the fabrication process. Between wafer 100 processing steps, a test pad 102 can be cut from the designated test area for taking measurements and testing. It is to be appreciated that depending on the implementations, the wafer 100 may comprise a number of test pad areas with defined patterns.

Figure 1B:
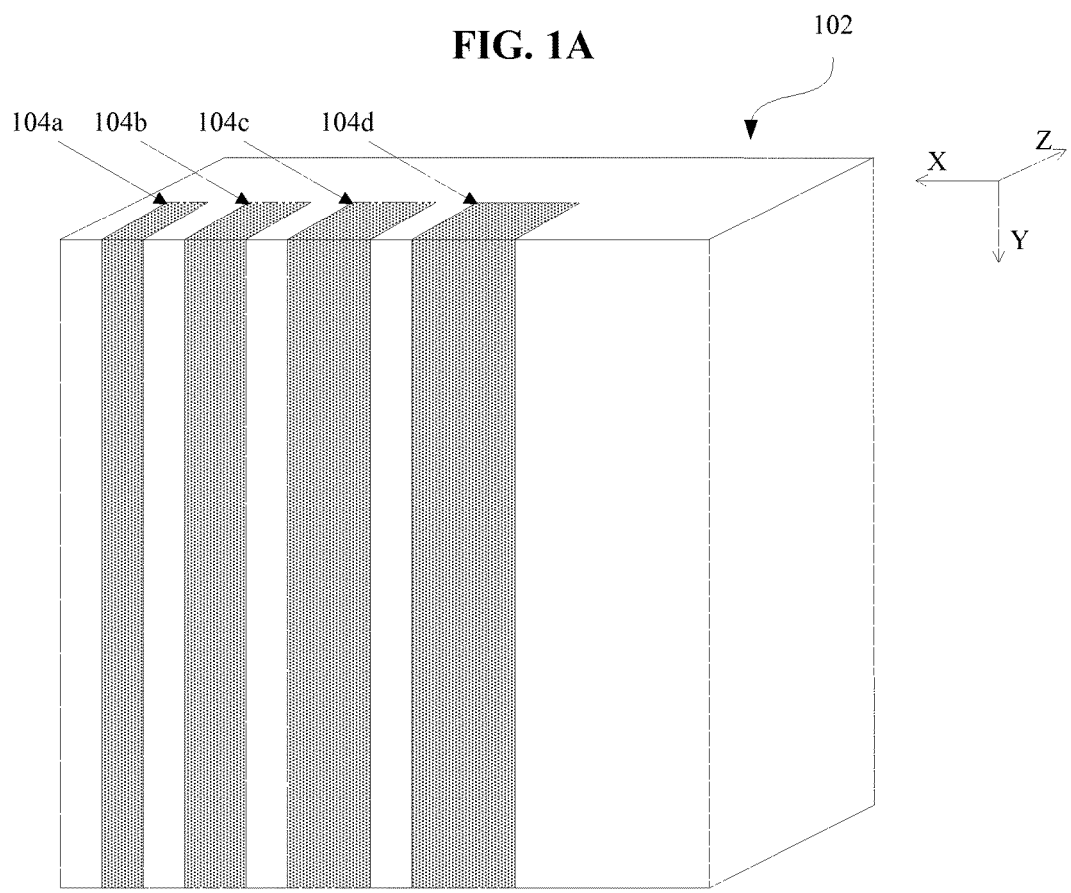
FIG. 1B is an illustration of the top view of a conventional test pad that has been removed from the designated test area of the wafer.

FIG. 1B is an illustration of the top view of a conventional test pad 102. For example, the test pad 102 is obtained from a test area of the wafer 100 in FIG. 1A. Depending on the wafer layout, there could a number of test areas. For example, to examine the shape and quality of trench shapes and filling material, a large number of tests area are needed, each exposing one or more trenches and materials deposited within the trenches. For example, patterns of the test pad 102 from top view (X-Y) plane consist of parallel trenches of varying widths. The X-Y plane of the test pad is parallel to the top surface of the top surface of the wafer 100. Test pad 102 has four trenches 104a-d of gradually varied widths etched in the top surface, and a layer of SiGe is deposited into the trenches 104a-d by epitaxy. Trenches 104a-d are parallel to each other. For example, the trenches are formed using an etching process that is also used for forming semiconductor on the wafer 100. The varied trench widths match various dimensions of devices fabricated on the wafer 100. Depending on the application, it might be desirable to examine one or more trenches, as they have different width. For example, the trench 104a is much narrower than the trench 104d. Typically, the trenches 104a-104d are referred to as a line array. For each of the trenches, to expose both length and width of the trench, two cross sections may be needed: one for length and one for width.

To take measurements of the embedded SiGe in a trench 104 of a certain width, test pad 102 is cut and scanned on the sides in both the X direction and the Y direction, as labeled in FIG. 1B. For example, to take measurements along the width of trench 104d, the X-Z plane side of the test pad is exposed by cutting the test pad across the X-Z plane. As shown in FIG. 1, by cutting along the X axis, a cross section parallel to the X-Z plane is obtained, which exposes 104a-d. Subsequent imaging technique (e.g., TEM, SEM, etc.) would provide an image of trenches on the X-Z plane, which shows the widths of the trenches 104a-d. However, just exposing the trenches on the X-Z plane is not enough. It is desirable (or necessary) to see the trenches on the Y-Z plane, where the length of the trenches are shown. For example, to image the width of the trench 104d, the test pad 102 is to be diced along the Y direction at the middle of the 104d along the Y-Z plane. More specifically, the test pad 102 is cut along the Y direction to expose trench 104d on the Y-Z plane surface so that the length of trench 104d is exposed on the side surface created by the cut. Imaging of the test pad (e.g., SEM or TEM scanning) can then be performed in the Y direction on the side (i.e., X-Z plane) of test pad 102 to take measurements along the length of trench 104d. Imaging of trenches on the Y-Z plane may be an important aspect of semiconductor imaging. For example, by examining the length of the trench 104d, various defects associated with the filling material may be revealed. As explained above, two cross sections are needed to show both length and width of the trench 104d. Thus, to take measurements of all four trenches 104a-d of varying widths, test pad 102 would be cut and scanned eight times using TEM. Typically, a test pad (e.g., test pad 102) can be only cut once (at the time when the test pad is diced from the wafer), more than one test pad is needed to show width(s) and length(s) of trench(es). And with each test pad, one or more imaging processes are performed. For example, to show the length of the trench 104d, the test pad 102 needs to be cut along the Y direction and in the middle of the trench 104d. Thus, with the line array pattern and arrangement, it is not possible to see both length and width of the trench 104d on the same test pad. Two test pads are needed: one test pad is cut along the X direction to reveal the X-Z plane cross section that shows the width of the trench 104d; another test pad is cut along the Y direction to reveal the Y-Z plane cross section that shows the length of the trench 104d. Thus, while the test pattern illustrated in FIG. 1B gets the job done, it is expensive and cumbersome. Wafer area is expensive, and can be better used as substrate for actual device than a large number of test pads. Cutting and scanning multiple test pads is a lengthy and time-consuming process. Additionally, the process of performing TEM or SEM on the test pad can be expensive, and by having to make two images for a single trench to show its length and width, the imaging cost is effective twice of that for a single image.

Embodiments of the present invention overcome the disadvantages of the prior art by presenting methods and designs of embedded SiGe epitaxy test pads that effectively reduce the number of test pads and imaging quantity by 50% or more. According to the embodiments described herein, both the length and the width measurements of SiGe in a trench of a certain width size can be obtained with just one TEM or SEM scan.

Figure 2A:
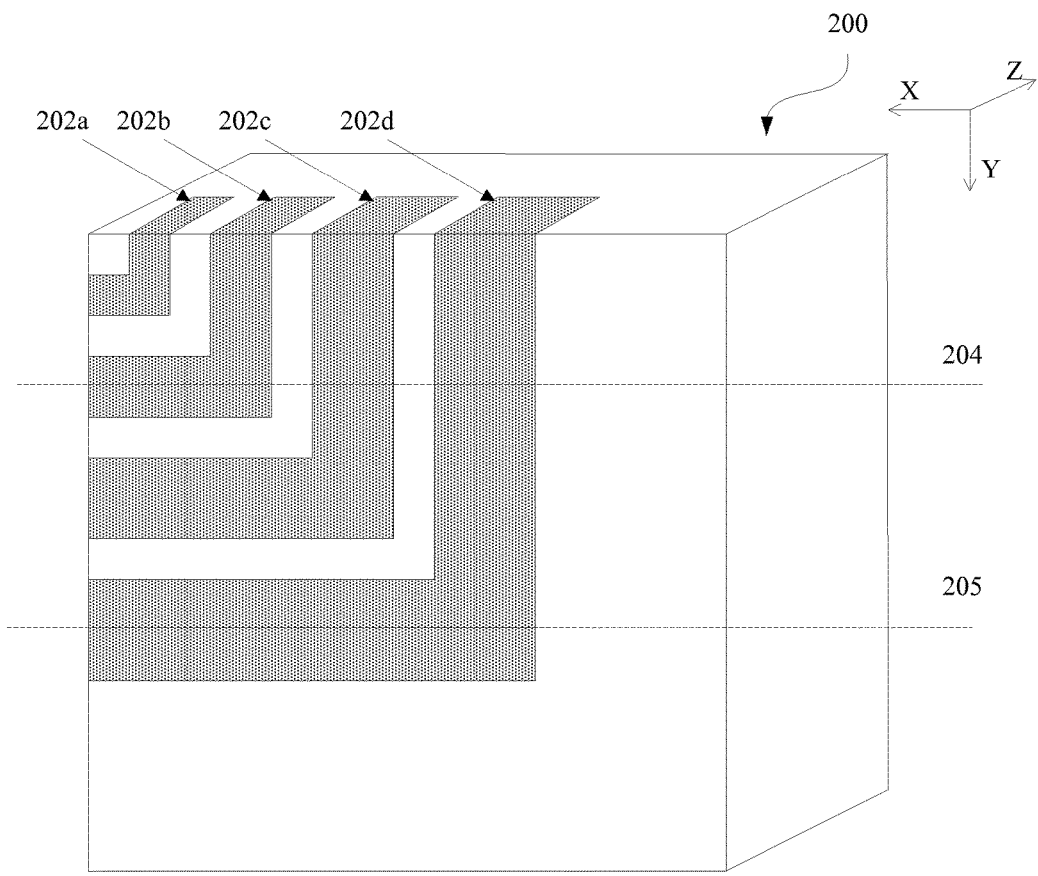
FIG. 2A is an illustration of the top view of one embodiment of an embedded SiGe epitaxy test pad.

FIG. 2A is an illustration of the top view of one embodiment of an embedded SiGe epitaxy test pad 200. This diagram is merely an example, which should not unduly limit the scope of the claims. One of ordinary skill in the art would recognize many variations, alternatives, and modifications. For example, the test pad 200 is obtained from the wafer 100 in FIG. 1A and may have similar dimensions as the test pad 102 in FIG. 1B. It is to be appreciated that while the test pad 200 and the test pad 102 may share similar dimensions, the test pad 200 can provide much more information than the test pad 102 with a single dicing or cut. Test pad 200 has four trenches 202a-d of gradually varied widths etched on the top surface. It is to be appreciated that depending on the specific implementation, the test pad 200 can have a number of trench patterns as needed. In other embodiments, there can be fewer than four or more than four trenches. Each trench 202 has an intersection structure, and includes two rectangular shaped trenches that are perpendicular to each other and are connected to each other at a right-angle intersection. The shallow trench isolation areas, indicated by the unshaded regions between trenches 202, are of substantially uniform widths so that the trenches 202 are evenly spaced apart. For example, the test pad 200 may include ten or more "L" shaped trenches with varying width. According to an embodiments, the shaped trenches on test pad 200 are characterized by width range from 10 nm to about 100 nm. For example, the width of the shaped trenches are associated with the dimensions of devices manufactured on the safe wafer as the test pad 200.

For example, test pad 200, along with other test pads formed on the same wafer, are manufactured using the same processes (e.g., etching, polishing, deposition, etc.) as the actual devices, thereby making the imaging of the test patterns meaningful. For example, the trenches on test pad 200 are formed by a plasma etching process, and the SiGe material is filled into the trenches using one or more deposition processes. As described above, SiGe processes refer to the use of SiGe material to modify characteristics of silicon substrate, and the embedded SiGe material improves performance of CMOS devices. For example, SiGe material are useful in 45/40 nm, 32/28 nm, and <22 nm processes. And for the test pad 200 to be useful, the dimensions of the test patterns are to approximate of actual devices. For example, depending on the process used for forming the SiGe fillings within the actual devices, one or more of the test patterns of the test pad 200 may be used. For example, the trenches 202a-d are characterized by different trench widths, which can be used to check different device dimensions. As an example, to take measurements of SiGe in trench 202b, test pad 200 is cut across line 204.

According to various embodiments, the patterns and shape of the trenches in test pad 200 are defined during a lithography process, where specific test patterns are selected based on the devices that are formed in the wafer. For example, test patterns of different sizes, with "L" shapes, are selected based on the sizes of the devices manufactured on the same wafer. For example, the test pattern for devices to be manufactured using a 22 nm process may be smaller than the test pattern for devices to be manufactured using a 45 nm process. In an automated system.

In various embodiment, lithography and etching processes are performed on both the semiconductor device and the test pad. For example, plasma etching process(es) are used to form trenches for devices and the trenches of the test patterns. The depth of the device trench and the test pattern trenches are substantially similar. For example, the trench depths for both devices and test patterns are about 50 nm±30 nm. Later to view the image of the test patterns, imaging is performed (e.g., using TEM or SEM scanning techniques), the depths of the trenches and the profiles thereof are substantially similar to that of the devices. For example, by analyzing the trench profiles of the test patterns, geometry and quality of the devices can be determined.

Figure 2B:
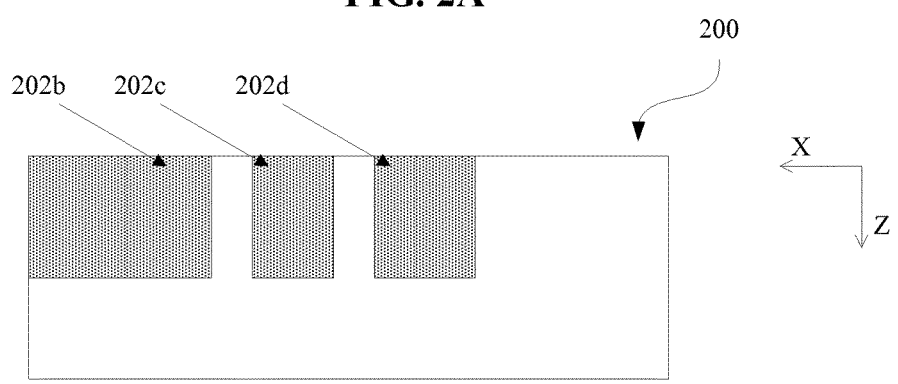
FIG. 2B is an illustration of the side view of the embodiment of embedded SiGe epitaxy test pad illustrated in FIG. 2A.

It is to be appreciated that the line 204 is selected specifically to show the length of trench 202b and the widths of trenches 202c and 202d. For example, by cutting through the length of the trench 202b (e.g., along the line 204), the length of the trench 202b and the widths of trenches 202c and 202d are exposed on the X-Z plane, as shown in FIG. 2B. Depending on the devices, it might be desirable to cut through other trenches. For example, it may be desirable to cut through the length of trench 202a, which would expose the length of the trench 202a and widths of trenches 202b-d. On other hand, the cutting along the line 205 would only show the length of 202d, and the widths of other trenches cannot be viewed.

Depending on the specific implementation, the location of cutting or polishing the test pad 200 can be performed in various ways. According to an embodiment, an image processing algorithm is used to select the location for cutting the test pad 200. For example, an image recognition algorithm analyses trench patters of the test pad 200, and selects the line 204 for cutting. According to various embodiment, the image recognition algorithm automatically selects the line 204 based a set of predetermined criteria, such as showing two or more trench width (e.g., 202c and 202d) and at least a single trench length (e.g., 202b). A laser cutting or dicing mechanism is then used to cut the test pad 200 along the line 204. It is to be appreciated that since the widths of the trenches can be narrow (e.g., less than 100 nm, and as narrow as about 10 nm), an automated process with relatively high precision is needed to select the cut position and to perform the cut.

In various embodiments, a polishing process is used to expose the desire cross section on the X-Z plane. For example, an image recognition algorithm determines the polishing line. A polishing mechanism is then to remove the portion of the test pad 200 above (or below) the line 204. For example, the amount of polishing and alignment of the polishing mechanism is set by the image recognition algorithm. In certain embodiments, the polishing mechanism selects start position for the polishing process. For example, since the line 204 is closer to the top edge of the test pad 200, the polishing mechanism selects the top edge as the starting point for the polishing process. On the other hand, the line 205 is closer to the bottom edge of the test pad 200, and the polishing mechanism selects the bottom edge as the starting point of the polishing process.

FIG. 2B is an illustration of the side view of the embodiment of embedded SiGe epitaxy test pad 200 illustrated in FIG. 2A, after the cut has been made at line 204. Both the length and the width of trench 202b is exposed on the side surface created by the cut. This allows the width and length measurements to be obtained with a single scan in the Y direction across the X-Z side of test pad 200. For example, SEM or TEM techniques may be used for imaging the cross section of the test pad 200, as shown in FIG. 2B.

As described above, an objective of creating the test patterns and later cutting the test pad at appropriate location is to provide a reference for determining the quality of the devices that are manufactured on the same wafer material. Therefore, it is important for the geometries and the processes thereof resemble that of the actual devices. For example, depths, lengths, widths, and/or other characteristics of the test trenches are similar to that of the actual devices. For example, if the SiGe trenches of the devices manufactured using a 42 nm process, the test patterns and trenches are manufactured using the same processes.

Figure 3A:
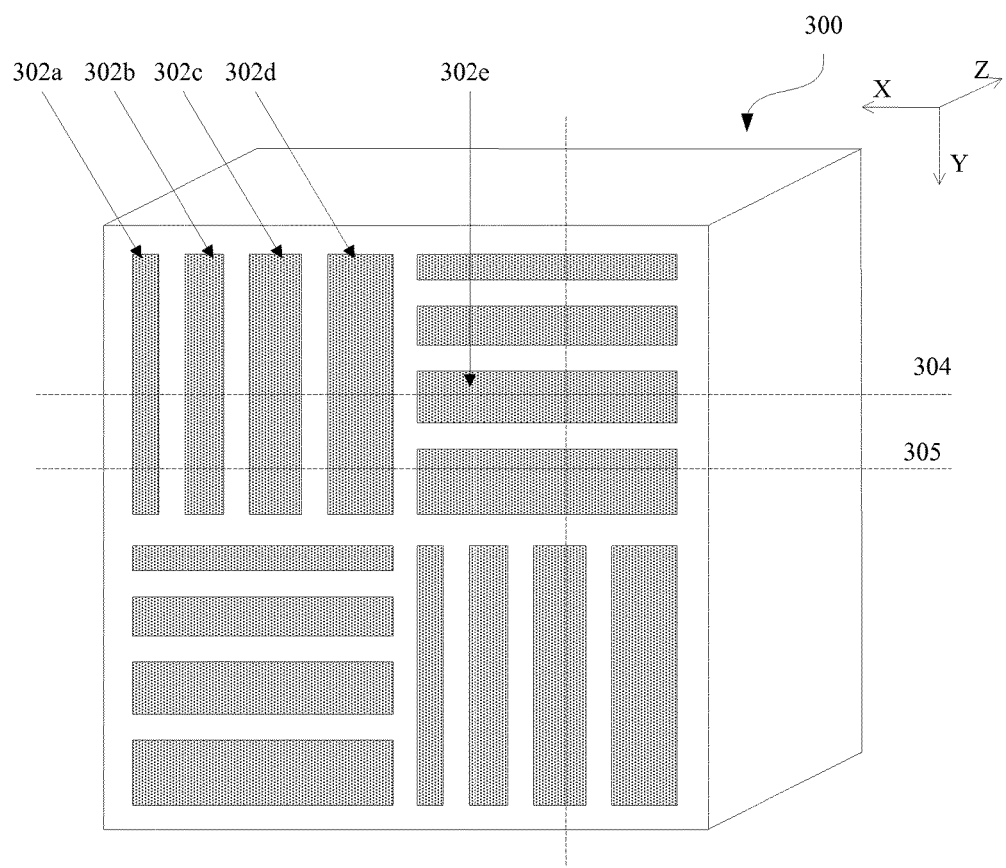
FIG. 3A is an illustration of the top view of another embodiment of an embedded SiGe epitaxy test pad.

FIG. 3A is an illustration of the top view of another embodiment of an embedded SiGe epitaxy test pad 300. This diagram is merely an example, which should not unduly limit the scope of the claims. One of ordinary skill in the art would recognize many variations, alternatives, and modifications. Test pad 300 has a total of 16 rectangular shaped trenches 302 etched into the top surface, not all of which have been labeled in order to avoid obscuring the figure. In other embodiments, there can be fewer than 16 or more than 16 trenches. Trenches 302 form a windmill structure on test pad 300 and are separated into four groups, with four trenches in each group. For example, trenches 302a-d form one group of trenches. In other embodiments, there can be any number of trenches in each group. Trenches in each group gradually vary in width, and the widths of the trenches in one group match the widths of the trenches in the other groups. Thus, for example, trench 302e is of the same width as trench 302c, as well as two other trenches in the other two groups. Trenches in each group are aligned horizontally. In other words, the width sides of the trenches in each group are aligned. Each group of trenches is perpendicular to an adjacent group of trenches, and positioned such that extending the length of a trench in one group would intersect the trenches in an adjacent group. For example, extending the length of trench 302e would intersect trenches 302a-d. In this embodiment, the shallow trench isolation areas (unshaded regions) are of uniform widths so that the trenches 302 are evenly spaced apart. To obtain measurements of SiGe in trenches having a width that is equal to the width of trenches 302c and 302e, test pad 300 is cut across line 304.

For example, test pad 300, along with other test pads formed on the same wafer, are manufactured using the same processes (e.g., etching, polishing, deposition, etc.) as the actual devices, thereby making the imaging of the test patterns meaningful. For example, the trenches on test pad 300 are formed by a plasma etching process, and the SiGe material is filled into the trenches using one or more deposition processes. As described above, SiGe processes refer to the use of SiGe material to modify characteristics of silicon substrate, and the embedded SiGe material improves performance of CMOS devices. For example, SiGe material are useful in 45/40 nm, 32/28 nm, and <22 nm processes. And for the test pad 300 to be useful, the dimensions of the test patterns are to approximate actual devices. For example, depending on the process used for forming the SiGe fillings within the actual devices, one or more of the test patterns of the test pad 300 may be used. For example, the trenches 302a-d are characterized by different trench widths, which can be used to check different device dimensions. As an example, to take measurements of SiGe in trench 302e, test pad 200 is cut across the line 304.

As shown in FIG. 3A, the test patterns are essentially arranged in four zones, each of the zones having multiple trench patterns of varying width. As an example, each of the zones is shown with four test trenches, but it is understood that other numbers of trenches are possible as well. According to embodiments of the present invention, test patterns (e.g., trenches 302a-d) are characterized by a width of about 10 nm to about 100 nm, which match the trench widths of actual devices. For example, each of the four zones may include a set of trench width that is different from other zones. For example, the top left zone comprises trench patterns with varying width ranging from 10 nm to 40 nm, the bottom right zone comprises trenches with varying width ranging from 50 nm to 100 nm, and so far and so forth. In various embodiments, the test patterns comprise more additional zones than the four shown in FIG. 3A.

It is to be appreciated that the trench patterns of test pad 300 can be easily manufactured using existing techniques.

For example, the test patterns of the test pad 300 comprise trench lines of different widths that correspond to the trench line dimensions of the actual devices manufactured on the same wafer. For example, the trenche lines are etched at a depth of about 30 to 100 nm using a plasma etching process. The test patterns of the test pad 300, along with the test patterns of additional test pads on the wafer, can be defined during a lithography step that is also used to define device etching patterns.

As mentioned above, the location of cutting or polishing the test pad 300 can be performed in various ways. According to an embodiment, an image processing algorithm is used to select the location for cutting the test pad 300. For example, an image recognition algorithm analyses trench patterns of the test pad 300, and selects the line 304 for cutting. For example, by cutting through the length of the trench 302e (e.g., through the line 304), the widths of trenches 302a-d are exposed as well. Similarly, cutting through the line 305 will also expose widths of the trenches 302a-d. Depending on the specific implementation, the imaging processing algorithm may choose to cut through the line 304 or line 305. For example, but cutting though the line 305, the cutting is performed on a relatively wider trench, and therefore there is more tolerance during the cutting process. On the other hand, it might be desirable to cut through line 304 to analyze the length of the trench 302e.

According to various embodiment, the image recognition algorithm automatically selects the line 304 based on a set of predetermined criteria. A laser cutting or dicing mechanism is then used to cut the test pad 300 along the line 304. It is to be appreciated that since the widths of the trenches can be narrow (e.g., less than 100 nm, and as narrow as about 10 nm), an automated process with relatively high precision is needed to select the cut position and to perform the cut.

Figure 3B:
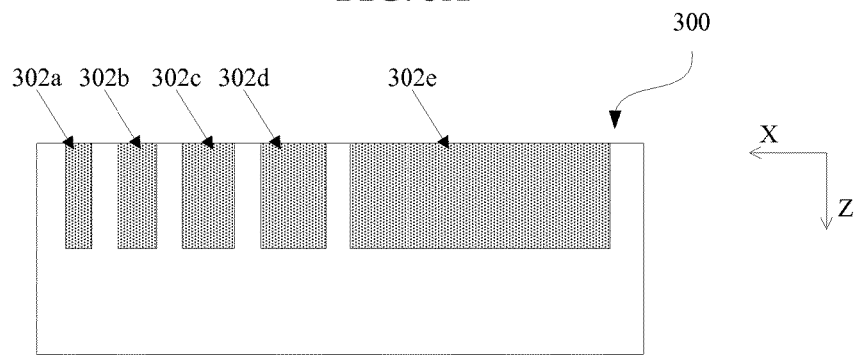
FIG. 3B is an illustration of the side view of the embodiment of embedded SiGe epitaxy test pad illustrated in FIG. 3A.

FIG. 3B is an illustration of the side view of the embodiment of embedded SiGe epitaxy test pad 300 illustrated in FIG. 3A, after the cut has been made at line 304. The side surface created by the cut exposes the length of trench 302e as well as the widths of trenches 302a-d. A single TEM scan can be performed in the X direction across the side of test pad 300 to obtain measurements for both the length and the width using trenches 302c and 302e. As described above, since the line 304 cut through the trench 302e, it is possible to select the specific area where the trench 302e is cut, so that the specific thickness of the trench 302e is shown.

Figure 4:
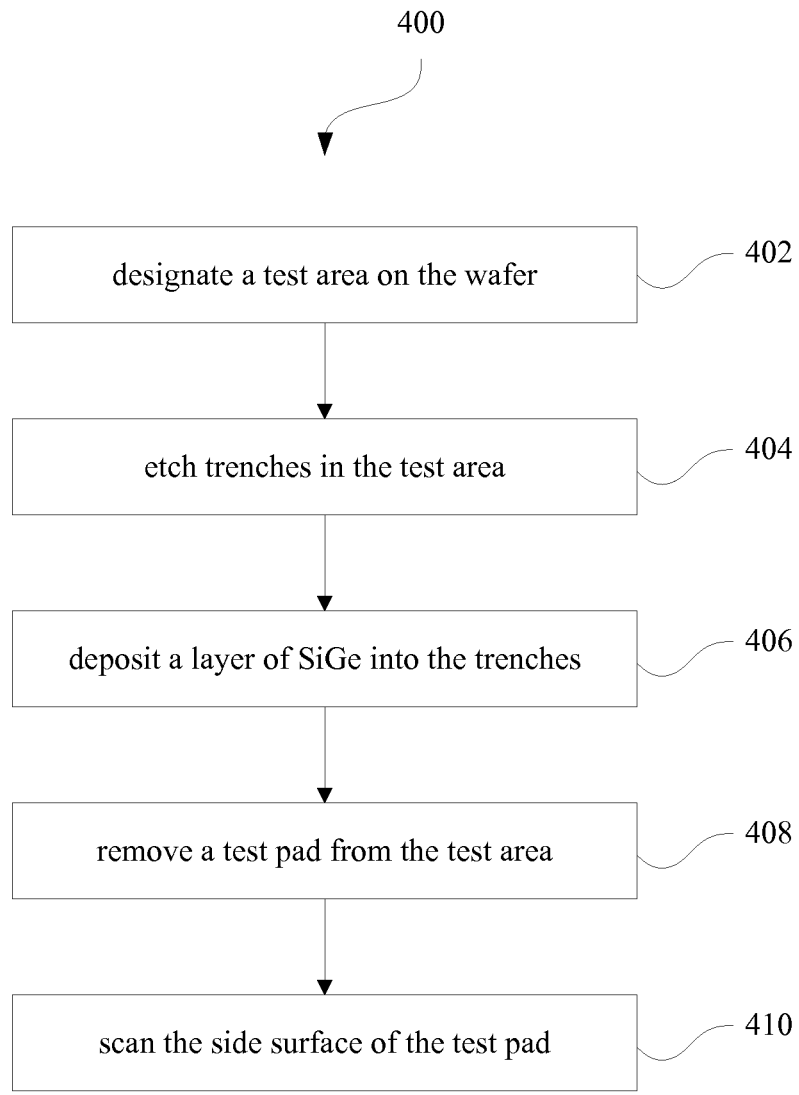
FIG. 4 is a flowchart of one embodiment of a process for measuring and testing semiconductor wafers during semiconductor device fabrication.

FIG. 4 is a simplified flowchart of one embodiment of a process 400 for measuring and testing semiconductor wafers during semiconductor device fabrication. This diagram is merely an example, which should not unduly limit the scope of the claims. One of ordinary skill in the art would recognize many variations, alternatives, and modifications. For example, blocks illustrated in FIG. 4 may be added, removed, repeated, replaced, modified, rearranged, and/or overlap, which should not limit the scope of the claims. Process 400 starts at Block 402 with the designation of a test area on the top surface of the wafer. Depending on the implementation, additional test areas may be designed. For example, test areas are positioned among the devices that are to be manufactured.

Next, trenches are etched in the test area according to any of the embodiments described herein (Block 404). For example, the etching process are performed on both the test area and the actual device, as explained above. For example, a lithograph process defines both test patterns and device patterns, based on which etching processes are performed. For example, plasma etching processes are used. At least two rectangular trenches that are perpendicular to each other are etched on the wafer in the test area during Block 404. In an embodiment, the two trenches are connected to each other to form a right-angle intersection. In some embodiments, the two trenches are separated by a shallow trench isolation area.

At Block 406, a layer of SiGe is deposited into the trenches by, for example, epitaxy. As mentioned above, SiGe material is deposited into both the trenches of the test patterns and the trenches of the actual devices. Depending on the specific implementation, the SiGe deposition into the trenches may be performed in more than one step. For example, the deposition within the trenches of both the test patterns and the actual devices can be formed using the same or substantially similar processes.

Next, a test pad is removed from the test area (Block 408). The test pad can be removed by cutting or by scribing and breaking. Depending on the implementation, specific steps may be performed to expose the desired cross section. At Block 410, a side surface that exposes both trenches is scanned using, for example, TEM. In some embodiments, the side that is scanned is polished before scanning is performed. Since the two trenches are both exposed and are perpendicular to each other, only one scan is needed to take measurements of the SiGe along the width and the length of the trenches.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A test pad cut from a semiconductor wafer for measuring and testing the semiconductor wafer during semiconductor device fabrication, the test pad comprising:
   a first rectangular trench and a second rectangular trench on a top surface of the test pad, wherein the first rectangular trench is spaced apart from the second rectangular trench on the top surface by at least one shallow isolation area, and wherein the first rectangular trench comprises a first side and a second side such that the first side is shorter than the second side, and the second rectangular trench comprises a first side and a second side such that the first side of the second rectangular trench is shorter than the second side of the first rectangular trench, wherein the second side of the first rectangular trench is perpendicular to e the second side of the second rectangular trench such that the second side of the first rectangular trench, if extended, intersects the second side of the second rectangular trench; and
   a side surface that exposes both the first rectangular trench and the second rectangular trench.

2. The test pad of claim 1, wherein the first rectangular trench has a connected trench structure such that a rectangular shaped trench on the top surface and the side surface are connected to form a right angle in the connected trench structure.

3. The test pad of claim 1, wherein the first rectangular trench and the second rectangular trench are separated by a shallow trench isolation area.

4. The test pad of claim 1, wherein a width of the first rectangular trench is equal to a width of the second rectangular trench.

5. The test pad of claim 1, further comprising:
   a third rectangular trench on the top surface of the test pad that is parallel to the first rectangular trench and has a width that is different from a width of the first rectangular trench.

6. The test pad of claim 5, wherein the width of the third rectangular trench is aligned with the width of the first rectangular trench.

7. The test pad of claim 5, wherein a length of the third rectangular trench is equal to the length of the first rectangular trench.

8. The test pad of claim 1, further comprising:
a plurality of additional rectangular trenches on the top surface of the test pad that are parallel to the first rectangular trench and gradually varied in width.

9. The test pad of claim 8, wherein the plurality of additional rectangular trenches are evenly spaced apart.

10. The test pad of claim 1, further comprising:
a layer of silicon-germanium in the first rectangular trench and the second rectangular trench that is deposited by epitaxy.

* * * * *